United States Patent
Zhou et al.

(10) Patent No.: US 7,598,161 B2
(45) Date of Patent: Oct. 6, 2009

(54) METHOD OF FORMING TRANSISTOR DEVICES WITH DIFFERENT THRESHOLD VOLTAGES USING HALO IMPLANT SHADOWING

(75) Inventors: Jingrong Zhou, Austin, TX (US); Mark Michael, Cedar Park, TX (US); Donna Michael, legal representative, Cedar Park, TX (US); David Wu, Austin, TX (US); James F. Buller, Austin, TX (US); Akif Sultan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/861,534

(22) Filed: Sep. 26, 2007

(65) Prior Publication Data
US 2009/0081860 A1    Mar. 26, 2009

(51) Int. Cl.
*H01L 21/425* (2006.01)
(52) U.S. Cl. .................. 438/527; 438/531; 438/514; 438/13; 257/E21.023
(58) Field of Classification Search .......... 438/531, 438/510, 513, 514, 527; 257/E21.023
See application file for complete search history.

(56) References Cited
U.S. PATENT DOCUMENTS
5,610,083 A * 3/1997 Chan et al. ............... 438/155

| | | | |
|---|---|---|---|
| 5,739,058 A * | 4/1998 | Karniewicz et al. | 438/217 |
| 6,242,329 B1 * | 6/2001 | Huster et al. | 438/531 |
| 6,372,587 B1 | 4/2002 | Cheek et al. | |
| 6,949,796 B1 * | 9/2005 | Ellis-Monaghan et al. | 257/335 |

FOREIGN PATENT DOCUMENTS
JP    09055438 A  *  2/1997

* cited by examiner

*Primary Examiner*—Matthew Smith
*Assistant Examiner*—Michele Fan
(74) *Attorney, Agent, or Firm*—Ingrassia, Fisher & Lorenz, P.C.

(57) ABSTRACT

The halo implant technique described herein employs a halo implant mask that creates a halo implant shadowing effect during halo dopant bombardment. A first transistor device structure and a second transistor device structure are formed on a wafer such that they are orthogonally oriented to each other. A common halo implant mask is created with features that prevent halo implantation of the diffusion region of the second transistor device structure during halo implantation of the diffusion region of the first transistor device structure, and with features that prevent halo implantation of the diffusion region of the first transistor device structure during halo implantation of the diffusion region of the second transistor device structure. The orthogonal orientation of the transistor device structures and the pattern of the halo implant mask obviates the need to create multiple implant masks to achieve different threshold voltages for the transistor device structures.

16 Claims, 4 Drawing Sheets

METHOD OF FORMING TRANSISTOR DEVICES WITH DIFFERENT THRESHOLD VOLTAGES USING HALO IMPLANT SHADOWING

TECHNICAL FIELD

Embodiments of the subject matter described herein relate generally to semiconductor device manufacturing. More particularly, embodiments of the subject matter relate to the use of halo implants during the fabrication of semiconductor transistor devices.

BACKGROUND

Semiconductor transistor devices and related manufacturing processes are well known. Ion implants in the channel regions of a semiconductor transistor device are utilized to obtain the desired device threshold voltage. Before ions are implanted in the channel regions, an implant mask is patterned on the wafer to protect certain areas from becoming implanted with the ions. Halo implants, which are doped regions formed by bombarding the semiconductor wafer with tilted beams of ions, are often used during the manufacture of semiconductor transistor devices.

It is desirable, from a design flexibility standpoint, to create a semiconductor device having transistors characterized by different threshold voltages ($V_T$). For example, it is desirable to have a set of semiconductor devices in a semiconductor technology having a mix of relatively low $V_T$ devices and relatively high $V_T$ devices. The fabrication of such a set of semiconductor devices using conventional semiconductor fabrication processes requires additional implant masks: the relatively low $V_T$ devices are formed via one mask (e.g., a low $V_T$ mask) and one implant step (or steps) using ion implants having one set of characteristics, while the relatively high $V_T$ device areas are protected by the low $V_T$ mask; and the relatively high $V_T$ devices are formed via another mask (e.g., a high $V_T$ mask) and another implant step (or steps) using ion implants having another set of characteristics, while the relatively low $V_T$ device areas are protected by the high $V_T$ mask. Additional $V_T$ variations on the same semiconductor wafer will require even more implant and mask steps and implants. The use of multiple implant masks in this manner results in increased manufacturing cost, additional process complexity, and increased manufacturing time.

BRIEF SUMMARY

Halo implant methods and a method of forming semiconductor transistor devices are described herein. These methods allow the manufacture of semiconductor transistor devices having different threshold voltages, using a reduced number of implant masking steps.

The above and other aspects may be carried out by an embodiment of a halo implant method for semiconductor devices. The method involves: forming a first device structure on a semiconductor substrate, the first device structure comprising a first diffusion region and a first gate structure over the first diffusion region, the first gate structure being oriented in a first direction relative to a reference direction; forming a second device structure on the semiconductor substrate, the second device structure comprising a second diffusion region and a second gate structure over the second diffusion region, the second gate structure being oriented in a second direction relative to the reference direction; forming an implant mask that selectively masks portions of the first device structure while leaving the first diffusion region substantially exposed, and that selectively masks portions of the second device structure while leaving the second diffusion region substantially exposed; halo implanting the first diffusion region using a first ion bombardment oriented in a first tilted direction, the implant mask shadowing the second diffusion region from the first ion bombardment; and halo implanting the second diffusion region using a second ion bombardment oriented in a second tilted direction, the implant mask shadowing the first diffusion region from the second ion bombardment.

The above and other aspects may be carried out by an embodiment of a method of forming semiconductor transistor devices. This method involves: providing a semiconductor wafer having formed thereon a first transistor device structure comprising a first diffusion region, and a second transistor device structure comprising a second diffusion region; forming an implant mask over selective portions of the first transistor device structure and over selective portions of the second transistor device structure, such that the first diffusion region becomes susceptible to halo implanting using ion bombardment oriented in a first tilted direction and immune to halo implanting using ion bombardment oriented in a second tilted direction, and such that the second diffusion region becomes susceptible to halo implanting using ion bombardment oriented in the second tilted direction and immune to halo implanting using ion bombardment oriented in the first tilted direction; halo implanting the first diffusion region using ion bombardment oriented in the first tilted direction; and halo implanting the second diffusion region using ion bombardment oriented in the second tilted direction.

The above and other aspects may be carried out by an embodiment of a halo implant method for a semiconductor wafer having formed thereon a first device structure comprising a first diffusion region, and a second device structure comprising a second diffusion region, the first device structure and the second device structure being oriented in different directions. The method involves: forming an implant mask over selective portions of the first device structure and over selective portions of the second device structure, such that the first diffusion region and the second diffusion region remain substantially exposed; halo implanting the first diffusion region, without halo implanting the second diffusion region, using a first ion bombardment oriented in a first tilted direction, the implant mask protecting the second diffusion region from the first ion bombardment; and halo implanting the second diffusion region, without halo implanting the first diffusion region, using a second ion bombardment oriented in a second tilted direction, the implant mask protecting the first diffusion region from the second ion bombardment.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

As device features become smaller and smaller, tilted angle halo implants are also used to control device $V_T$. One drawback for tilted angle implants is its shadowing effect. When device features become smaller, the shadowing effect prevents the implant from going into the silicon as desired and, therefore, considerable efforts have been taken in the past to avoid this type of shadowing condition. The technique described herein leverages this "drawback" as an advantage by utilizing the shadowing effect to produce multi-$V_T$ devices on the same wafer without having to create multiple masks.

Figure 1:
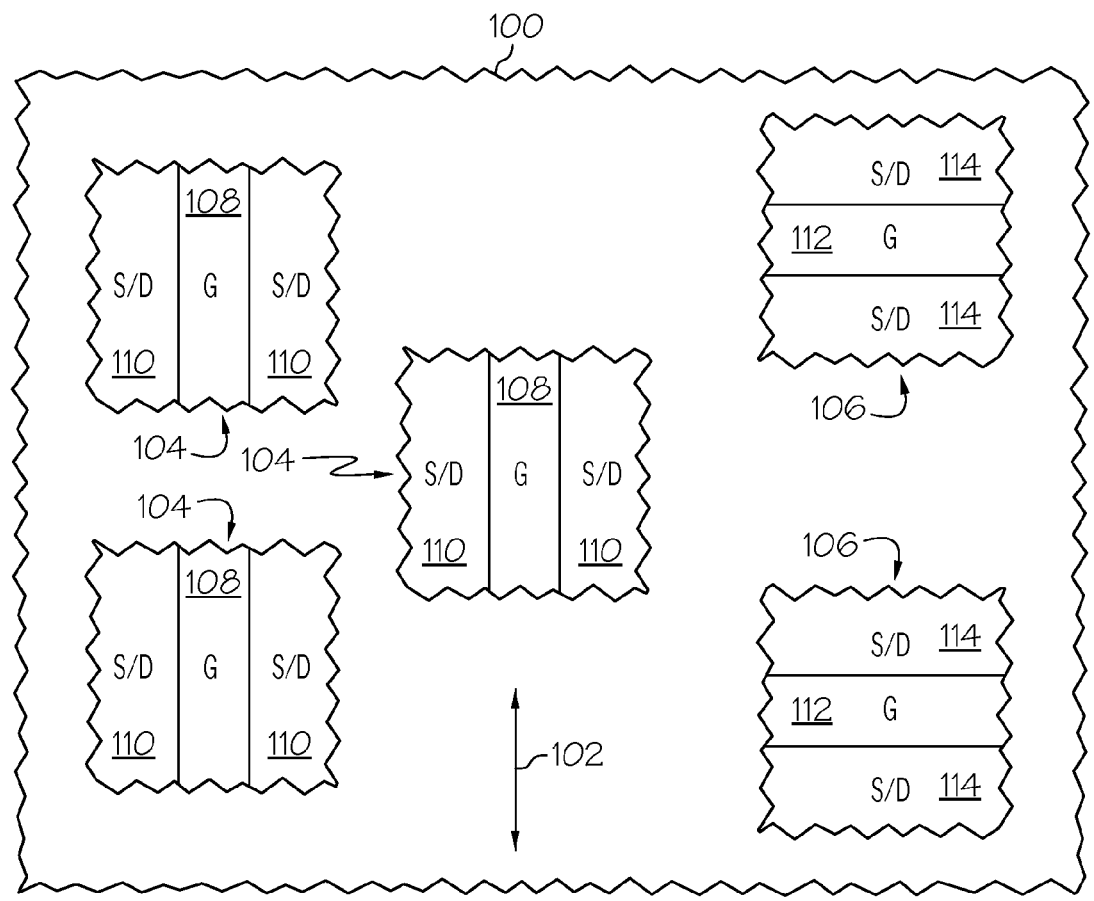
FIG. 1 is a schematic top view of a portion of a semiconductor wafer having device structures oriented in different directions.

FIG. 1 is a schematic top view of a portion of a semiconductor wafer 100 having transistor device structures oriented in different directions relative to a reference direction 102 on wafer 100 (reference direction 102 is arbitrarily shown in FIG. 1 as an upward/downward pointing arrow). For this simplified example, wafer 100 includes three transistor device structures 104 oriented in one direction on the semiconductor substrate and two transistor device structures 106 oriented in another direction on the semiconductor substrate. Each transistor device structure 104 includes a gate structure 108, which is formed over a diffusion region (not shown). The diffusion region is located between two source/drain regions 110. In the illustrated embodiment, gate structures 108 are generally oriented with reference direction 102. In other words, the axes corresponding to the major longitudinal dimension of gate structures 108 are parallel with reference direction 102. Similarly, each transistor device structure 106 also includes a gate structure 112 formed over a diffusion region (not shown) and two source/drain regions 114. In contrast to transistor device structures 104, gate structures 112 are generally oriented in a different direction than reference direction 102. In other words, the axes corresponding to the major longitudinal dimension of gate structures 112 are not parallel with reference direction 102. For this particular embodiment, transistor device structures 104 are orthogonally oriented relative to transistor device structures 106. In other words, gate structures 108 form ninety degree angles with gate structures 1 12.

For ease of description FIG. 1 depicts an overly simplified layout for wafer 100. An embodiment of wafer 100, however, may include any number of device structures arranged in either orientation. In addition, the device structures in an embodiment of wafer 100 need not be arranged in an orthogonal orientation as described herein. Moreover, an embodiment of wafer 100 may include device structures arranged in more than two orientations relative to reference direction 102.

In certain applications it may be desirable to enhance the doping of semiconductor device structures using halo implants, which are formed by exposing the device structures to ion bombardment having a tilted or angled approach relative to the surface of the wafer. Halo implants and processes related thereto are generally known to those skilled in the art. For example, a halo implant technique is described in U.S. Pat. No. 6,372,587, titled Angled Halo Implant Tailoring Using Implant Mask, the relevant content of which is incorporated herein by reference.

Figure 2:
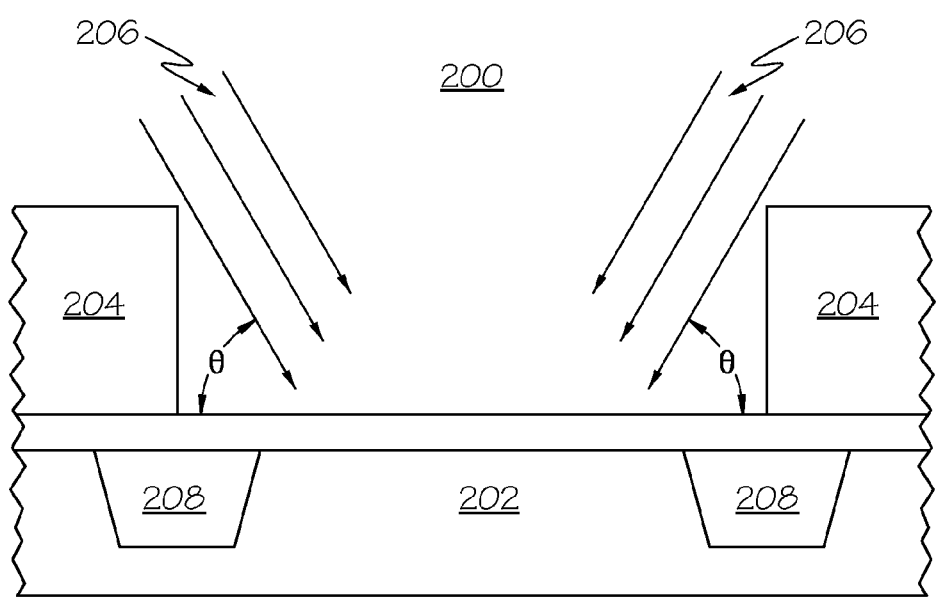
FIG. 2 is a cross sectional view of a semiconductor device structure undergoing a conventional halo implantation step.

Conventional aspects of halo implants and related halo implantation process steps will not be described in detail here. Rather, a brief background description will be provided with reference to FIG. 2, which is a cross sectional view of a semiconductor device structure 200 undergoing a conventional halo implantation step. FIG. 2 schematically depicts a conventional technique for implanting angled halo implants into a silicon substrate 202. A portion of device structure 200 has been covered by a photoresist mask 204.

As shown in FIG. 2, a halo dopant 206 (indicated by ion bombardment arrows) is implanted to introduce dopant atoms and/or molecules to form the angled halo implants in silicon substrate 202. Typically, silicon substrate 202 is tilted at an angle with respect to a horizontal direction in an implanter (not shown) and the halo dopant 206 is directed downward in a vertical direction. Alternatively, silicon substrate 202 could be disposed in the horizontal direction in the implanter and the halo dopant 206 could be directed downward at an angle with respect to the horizontal direction in the implanter, and/or any other combination of tilt and implant direction could be used as long as the desired bombardment angle is achieved. After implanting one side of device structure 200, the wafer is typically rotated 180 degrees for additional implantation of halo dopant 206.

The halo dopant 206 can be implanted into a region that will eventually become the source-drain extension (SDE) region of a transistor, and into a region that will eventually become the source region of the transistor. However, the dosage of halo dopant 206 is typically at least an order of magnitude less than the dosage of the dopant for the SDE region. Typically, a dose of the halo dopant atoms and/or molecules is within the range of approximately $1.0 \times 10^{12}$ ions/cm$^2$ to approximately $1.0 \times 10^{14}$ ions/cm$^2$. The halo dopant may be, for example, boron (B) or boron difluoride (BF$_2$) or Indium (In) for an NMOS transistor (the p-type halo implant serving to reinforce the p-type doping of the channel region of the NMOS transistor), or arsenic (As) or phosphorus (P) or antimony (Sb) for a PMOS transistor (the n-type halo implant serving to reinforce the n-type doping of the channel region of the PMOS transistor). Typically, the implant energy of the halo dopant atoms and/or molecules is within the range of approximately 5 keV to approximately 70 keV.

By way of contrast, a typical dose of dopant for the SDE region is within the range of approximately $1.0 \times 10^{14}$ ions/cm$^2$ to $1.0 \times 10^{15}$ ions/cm$^2$ of the appropriate dopant atoms and/or molecules, e.g., As or P for an NMOS transistor or B or BF$_2$ for a PMOS transistor. The implant energy of the halo dopant atoms and/or molecules for the SDE region is within the range of about 3 keV to about 50 keV.

FIG. 2 also depicts shallow trench isolation regions (STI) 208 in silicon substrate. The angled halo implants are intended to be located between STI regions 208. Conventional halo implantation techniques utilize relatively wide spacing between the features of mask 204 to ensure that halo dopant 206 reaches the intended region without shadowing by mask 204. In other words, silicon substrate 202 will become implanted as desired.

The halo implantation techniques described herein facilitate the manufacture of semiconductor transistor devices on a single wafer, where the transistor devices have different threshold voltages. Conventionally, different $V_T$ devices are formed using different implant steps (using different dosages and/or implant energies), with separate intervening implant masking steps. In contrast to such conventional processes, the techniques described herein need not employ separate implant masks to create the different $V_T$ devices. Rather, the techniques utilize a single implant mask in conjunction with halo implant shadowing in a manner that accommodates multiple halo implant steps.

Figure 3:
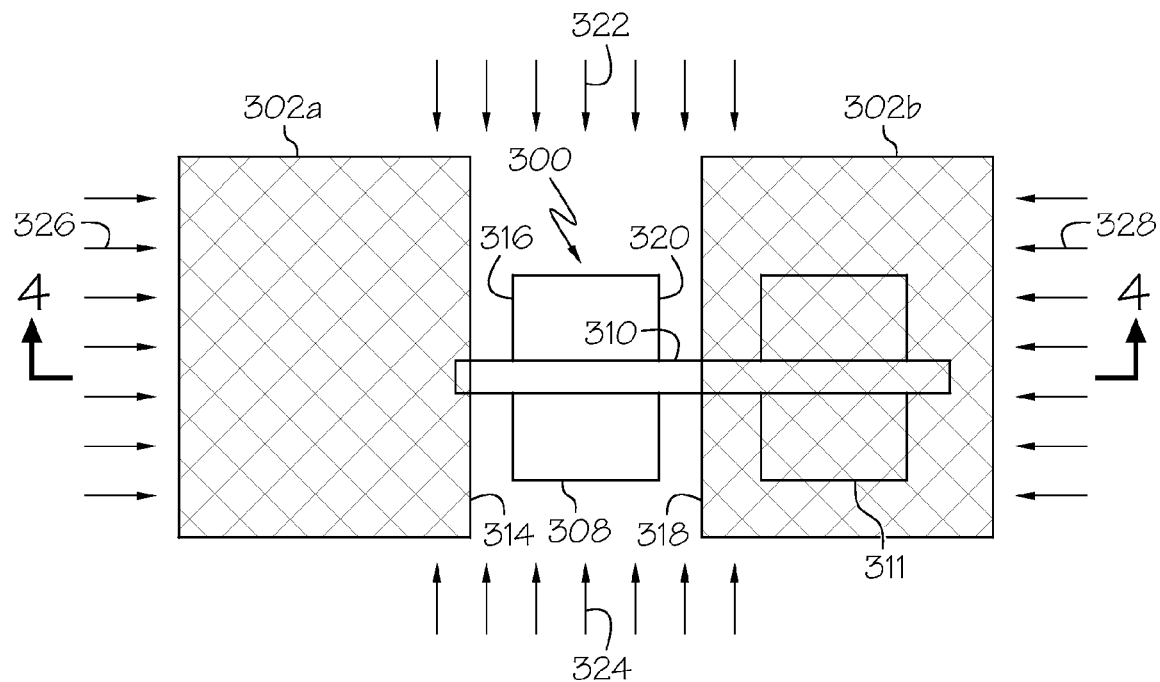
FIG. 3 is a schematic top view of semiconductor device structures oriented in a first direction.
Figure 4:
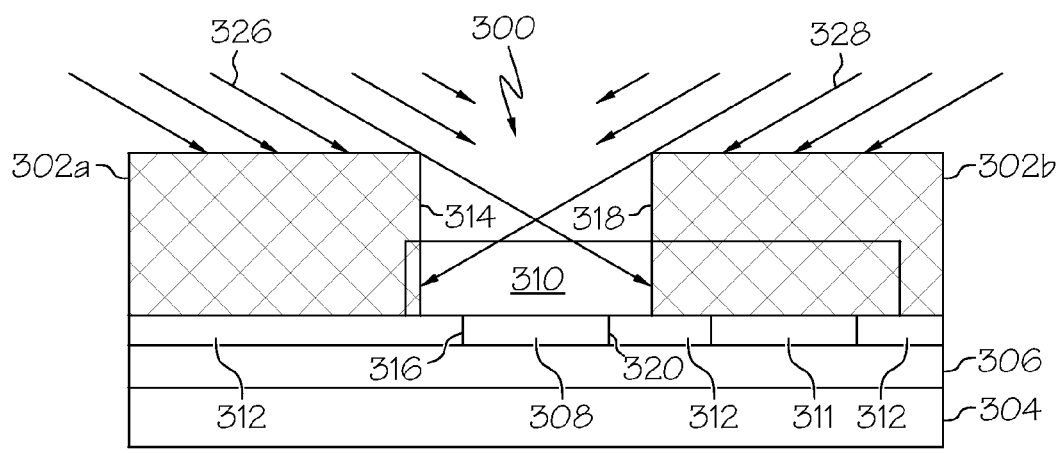
FIG. 4 is a cross sectional view of the semiconductor device structures as viewed along line 4-4 in FIG. 3.
Figure 5:
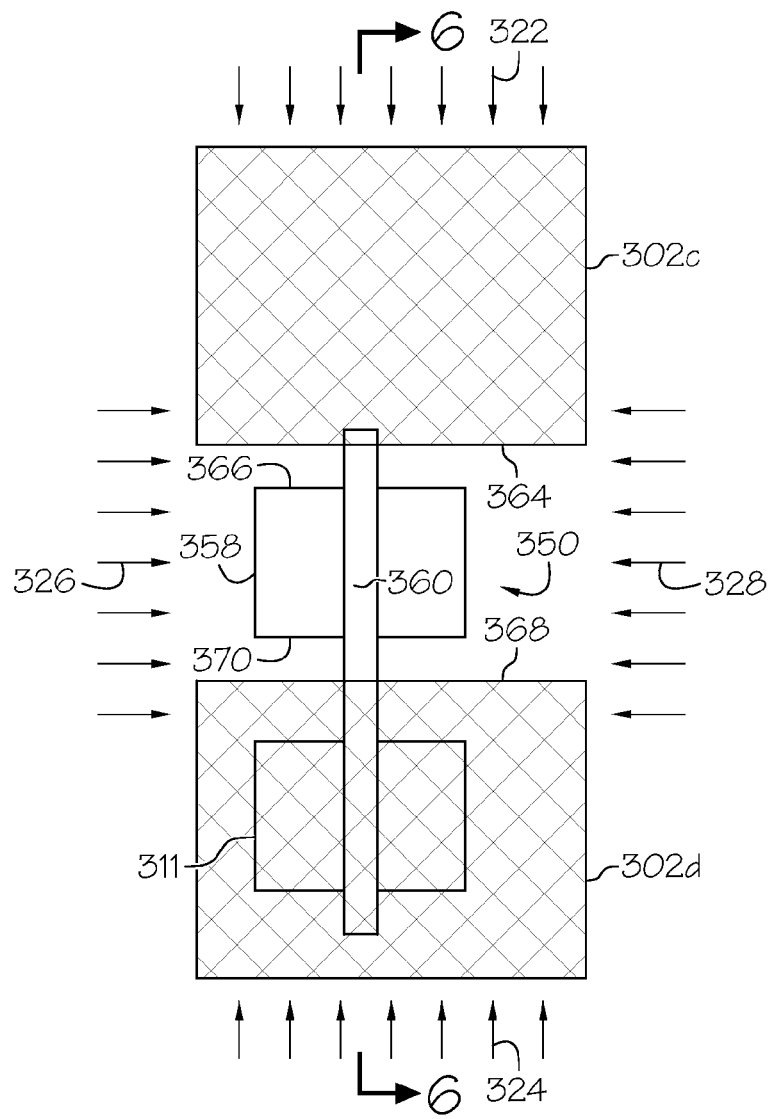
FIG. 5 is a schematic top view of semiconductor device structures oriented in a second direction.
Figure 6:
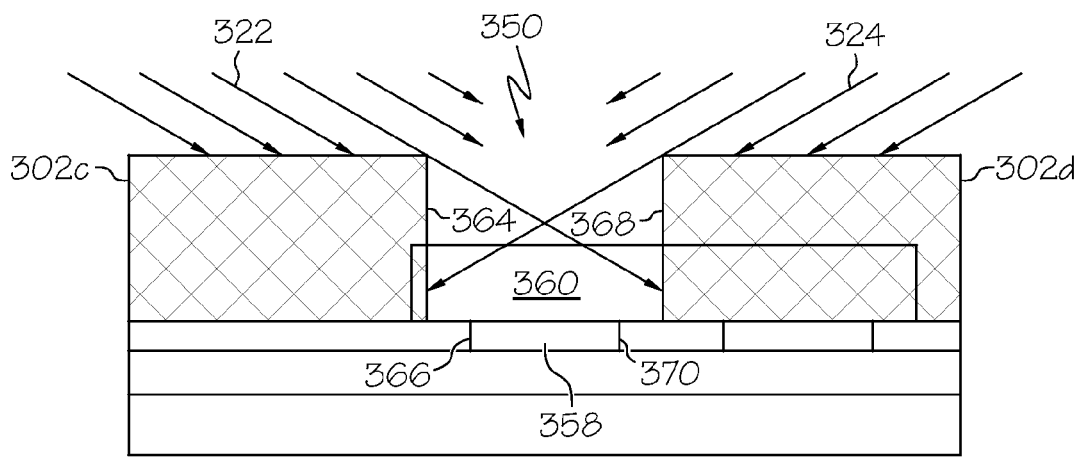
FIG. 6 is a cross sectional view of the semiconductor device structures as viewed along line 6-6 in FIG. 5.

FIG. 3 is a schematic top view of semiconductor device structures oriented in a first direction relative to a reference direction of the semiconductor substrate and/or the wafer, and FIG. 4 is a cross sectional view of the semiconductor device structures as viewed along line 4-4 in FIG. 3. For this example, FIG. 3 and FIG. 4 depict a semiconductor transistor device structure 300 having a gate structure that is arbitrarily oriented in a west-east direction. Upon completion of the fabrication process, transistor device structure 300 will become a semiconductor transistor. The orientation of transistor device structure 300 corresponds to the orientation of transistor device structures 106 shown in FIG. 1. In contrast, FIG. 5 is a schematic top view of semiconductor device structures oriented in a second direction relative to the reference direction, and FIG. 6 is a cross sectional view of the semiconductor device structures as viewed along line 6-6 in FIG. 5. For this example, FIG. 5 and FIG. 6 depict a semiconductor transistor device structure 350 having a gate structure that is arbitrarily oriented in a north-south direction. Upon completion of the fabrication process, transistor device structure 350 will become a semiconductor transistor. The orientation of transistor device structure 350 corresponds to the orientation of transistor device structures 104 shown in FIG. 1. Notably, FIGS. 3-6 are intended to depict device structures formed on the same semiconductor substrate and, therefore, the same wafer.

FIGS. 3-6 depict intermediate states in the wafer fabrication process after the formation of transistor device structures 300/350 and after the formation of a suitably patterned implant mask 302. These transistor device structures 300/350, which may be NMOS devices or PMOS devices, are formed using well known techniques and process steps (e.g., techniques and steps related to doping, photolithography and patterning, etching, material growth, material deposition, surface planarization, and the like). For this embodiment, transistor device structure 300 includes, without limitation: a semiconductor support substrate 304; a buried oxide layer 306; a diffusion (active) region 308; and a gate structure 310. FIG. 3 also depicts a diffusion region 311 for a neighboring transistor device structure, and FIG. 4 also depicts shallow trench isolation (STI) regions 312. Transistor device structure 350 (FIG. 5 and FIG. 6) is similar to transistor device structure 300 in many respects. For the sake of brevity, common features, characteristics, and process steps will not be redundantly described here in the context of transistor device structure 350.

Semiconductor support substrate 304 is preferably a monocrystalline silicon substrate, where the term "silicon substrate" is used herein to encompass the generally monocrystalline and relatively pure silicon materials typically used in the semiconductor industry. Semiconductor support substrate 304 can be either N-type or P-type, but is typically P-type. Here, buried oxide layer 306 and the layer of silicon above buried oxide layer 306 for what is commonly known as a silicon-on-insulator (SOI) structure that, in turn, is supported by semiconductor support substrate 304. Buried oxide layer 306 is a layer of oxide (SiO$_2$) buried in the wafer. The thickness of buried oxide layer 306 is typically within the range of about 40 nm to about 100 nm.

Diffusion region 308 represents the source/drain regions and the gate channel of transistor device structure 300. The source/drain regions are doped with N-type or P-type impurity dopants, depending upon the implementation. These regions can be doped to the appropriate conductivity, for example, by ion implantation. STI regions 312 are employed to isolate around individual devices that must be electrically isolated. As is well known, there are many processes that can be used to form diffusion region 308 and STI regions 312, and such processes need not be described here in detail. The SOI film is thin enough so that the gate fully depletes the channel and thus electrically insulates the source and drain. For SOI applications, mesa isolation can be utilized in lieu of STI regions 312.

Gate structure 310 is located over diffusion region 308, as depicted in FIG. 4. As described with reference to FIG. 1, transistor device structure 300 can be characterized by the major longitudinal axis of gate structure 310, which runs in the west-east direction in FIG. 3. Gate structure 310 can be formed using known process steps and the particular composition of gate structure 310 and the manner in which gate structure 310 is formed will not be described in detail here. Indeed, FIG. 4 depicts gate structure 310 in a simplified manner; in practice, gate structure 310 is realized as a stacked arrangement having, for example, a gate insulator such as an oxide, a gate metal (such as TiN, La, Er, Tb, Pt, Ni, Ir, Ru, RuO$_2$, IrO$_2$, TaCN, TaN, W, or WN), and polysilicon between the gate insulator and the gate metal. In accordance with known techniques, the gate metal layer may extend beyond transistor device structure 300 (as shown in FIG. 3) to accommodate the formation of conductive interconnects for the gate metal layer. Moreover, the gate metal layer may be shared by other transistor device structures.

Transistor device structures 300/350 can be provided by performing various fabrication steps that result in that depicted in FIGS. 3-6. Thereafter, transistor device structures 300/350 can be further processed and subjected to halo implantation in the manner described herein. For example, implant mask 302 is formed from a photoresist material using appropriate photoresist application and photolithography techniques. Implant mask 302 is a common mask that is shared by transistor device structures 300/350. In this regard, FIG. 3 and FIG. 4 depict two portions of implant mask 302a/

302b, and FIG. 5 and FIG. 6 depict two portions of implant mask 302c/302d. The use of the common reference number "302" indicates that only one implant mask 302 is formed.

Implant mask 302 selectively masks portions of transistor device structures 300/350 while leaving the respective diffusion regions substantially exposed (as depicted in FIG. 3 and FIG. 5). Referring to FIG. 3 and FIG. 4, implant mask portions 302a/302b form a canyon for diffusion region 308. In this regard, implant mask portion 302a terminates at a sidewall 314 having a length (in the north-south direction of FIG. 3) that is greater than or equal to the length of diffusion region 308. As shown in FIG. 4, implant mask 302 covers a portion of gate structure 310 and, therefore, the thickness/height of sidewall 314 exceeds the height of gate structure 310. Moreover, the edge of sidewall 314 is located such that it does not overlap the edge 316 of diffusion region 308 (FIG. 4). Similarly, implant mask portion 302b terminates at a sidewall 318 having a length that is greater than or equal to the length of diffusion region 308. The thickness/height of sidewall 318 exceeds the height of gate structure 310, and the edge of sidewall 318 is located such that it does not overlap the edge 320 of diffusion region 308. FIG. 4 schematically illustrates how diffusion region 308 sits at the bottom of the canyon formed between sidewalls 314/318. In this embodiment, the canyon generally runs in the north-south direction of FIG. 3. In other words, the canyon is orthogonally oriented relative to the direction of gate structure 310.

Likewise, implant mask portions 302c/302d form a canyon for a diffusion region 358 of transistor device structure 350 (FIG. 5 and FIG. 6). The sidewall 364 of implant mask portion 302c and the sidewall 368 of implant mask portion 302d run in the east-west direction of FIG. 5, rather than in the north-south direction. In this embodiment, the lengths of sidewalls 364/368 are greater than or equal to the length of diffusion region 358, and the thickness/height of sidewalls 364/368 exceeds the height of a gate structure 360 of transistor device structure 350. The edge of sidewall 364 is located such that it does not overlap the edge 366 of diffusion region 358, and the edge of sidewall 368 is located such that it does not overlap the edge 370 of diffusion region 358. FIG. 6 schematically illustrates how diffusion region 358 sits at the bottom of the canyon formed between sidewalls 364/368. In this embodiment, the canyon generally runs in the east-west direction of FIG. 5. In other words, the canyon is orthogonally oriented relative to the direction of gate structure 360.

Implant mask 302 is formed and patterned with a topography that makes diffusion region 308 of transistor device structure 300 susceptible to halo implanting using ion bombardment oriented in certain tilted directions (e.g., a first tilted direction) and immune to halo implanting using ion bombardment oriented in other tilted directions (e.g., a second tilted direction). The topography of implant mask 302 also makes diffusion region 358 of transistor device structure 350 susceptible to halo implanting using ion bombardment oriented in certain tilted directions (e.g., the second titled direction) and immune to halo implanting using ion bombardment oriented in other tilted directions (e.g., the first tilted direction). FIGS. 3-6 schematically illustrate different ion bombardment directions for the described embodiment. In FIG. 3 and FIG. 5, four different ion bombardment directions are depicted, corresponding to four different halo implants. For this embodiment, the wafer is exposed (during different process steps) to ion bombardment 322 corresponding to a first halo implant and having a first tilted direction, ion bombardment 324 corresponding to a second halo implant and having a second tilted direction, ion bombardment 326 corresponding to a third halo implant and having a third tilted direction, and ion bombardment 328 corresponding to a fourth halo implant and having a fourth tilted direction. The top views of FIG. 3 and FIG. 5 depict the projected directions of the ion bombardments on the semiconductor substrate (or the wafer). To maintain the readability of FIG. 3 and FIG. 5, the directional arrows do not extend across implant mask 302 or transistor device structures 300/358. For this particular example, the projected direction of ion bombardment 322 is anti-parallel to the projected direction of ion bombardment 324, and the projected direction of ion bombardment 326 is anti-parallel to the projected direction of ion bombardment 328. Moreover, the projected direction of ion bombardment 322 is orthogonal to the projected directions of ion bombardments 326/328, and the projected direction of ion bombardment 324 is also orthogonal to the projected directions of ion bombardments 326/328.

The tilted/angled orientation of the four halo implants is not discernable in FIG. 3 or FIG. 5. In reality, each of the ion bombardment directions shown in FIG. 3 corresponds to a direction pointing toward diffusion region 308 and at an elevation angle relative to the plane generally defined by the wafer (see, for example, the angle θ in FIG. 2, which indicates the tilted angle of attack for halo dopant 206). The cross sectional view of FIG. 4 depicts the tilted nature of ion bombardments 326/328, which are utilized during halo implanting of diffusion region 358 of transistor device structure 350. For the sake of clarity, ion bombardments 322/324 are not shown in FIG. 4. Notably, implant mask portion 302a shadows diffusion region 308 from ion bombardment 326, while implant mask portion 302b shadows diffusion region 308 from ion bombardment 328. Thus, features of implant mask portion 302a prevent ion bombardment 326 from directly reaching diffusion region 308, and features of implant mask portion 302b prevent ion bombardment 328 from directly reaching diffusion region 308. In this regard, FIG. 4 shows how some of the halo dopant paths are completely blocked by implant mask portions 302a/302b. On the other hand, some of the halo dopant paths are directed into the canyon between sidewalls 314/318; the halo dopant in these paths does not reach diffusion region 308. In other words, implant mask portion 302a protects diffusion region 308 from ion bombardment 326, and implant mask portion 302b protects diffusion region 308 from ion bombardment 328.

Referring again to FIG. 3, implant mask 302 is suitably configured to allow halo implanting of diffusion region 308 using ion bombardments 322/324. In particular, implant mask 302 is formed such that ion bombardments 322/324 have a relatively free path to diffusion region 308 through the canyon formed between sidewalls 314/318. In other words, implant mask 302 neither shadows nor protects diffusion region 308 from ion bombardments 322/324.

The four different halo implant ion bombardments are also shown in FIG. 5, oriented in the same relative directions as that shown in FIG. 3. For the sake of clarity, FIG. 6 only depicts ion bombardments 322/324. The cross sectional view of FIG. 6 depicts the tilted nature of ion bombardments 322/324, which are utilized during halo implanting of diffusion region 308 of transistor device structure 300. Notably, implant mask portion 302c shadows diffusion region 358 from ion bombardment 322, while implant mask portion 302d shadows diffusion region 358 from ion bombardment 324. Thus, features of implant mask portion 302c prevent ion bombardment 322 from directly reaching diffusion region 358, and features of implant mask portion 302d prevent ion bombardment 324 from directly reaching diffusion region 358. In other words, implant mask portion 302c protects diffusion region 358 from ion bombardment 322, and implant mask portion 302d protects diffusion region 358 from ion bombardment 324. FIG. 6 illustrates these characteristics: some of the halo dopant paths are completely blocked by implant mask portions 302c/302d. On the other hand, some of the halo dopant paths are directed into the canyon between sidewalls 364/368; the halo dopant in these paths does not reach diffusion region 358.

Referring again to FIG. 5, implant mask 302 is suitably configured to allow halo implanting of diffusion region 358 using ion bombardments 326/328. In particular, implant mask 302 is formed such that ion bombardments 326/328 have a relatively free path to diffusion region 358 through the canyon formed between sidewalls 364/368. In other words, implant mask 302 neither shadows nor protects diffusion region 358 from ion bombardments 326/328.

The common implant mask 302 facilitates halo implanting of diffusion region 308 of transistor device structure 300, without halo implanting diffusion region 358 of transistor device structure 350, using ion bombardments 322/324. The common implant mask 302 also facilitates halo implanting of diffusion region 358, without halo implanting diffusion region 308, using ion bombardments 326/328. The canyons formed by implant mask 302, in conjunction with the approach angles and directions of the halo dopants, allow such multiple halo implanting steps without having to form more than one halo implant mask.

In practice, the elevation angle of a halo implant relative to the plane generally defined by the wafer, the azimuth angle of a halo implant relative to a reference direction of the wafer, the height of the protective sidewalls of the implant mask that surround the diffusion regions of the transistor device structures, the dimensions of the canyon formed between the protective sidewalls, the distances between the edges of the protective sidewalls and the protected diffusion region, and other geometries are chosen to provide the desired amount of halo implant shadowing and to allow the desired amount of halo implantation using the specified halo implant dosages and energy levels. For example, if the elevation angle of ion bombardments 326/328 is significantly less than that shown in FIG. 4, then the height of implant mask portions 302a/302b could be reduced. Conversely, if the elevation angle of ion bombardments 326/328 is significantly greater than that shown in FIG. 4, then the height of implant mask portions 302a/302b would need to be increased to provide the same level of shadowing. As another example, if sidewalls 314/318 are formed closer to diffusion region 308 than as shown in FIG. 4, then the height of implant mask portions 302a/302b could be reduced. Of course, the design of the implant mask might be influenced by certain relatively inflexible parameters such as process limitations, dopant dosages, desired device $V_T$, or the like.

Figure 7:
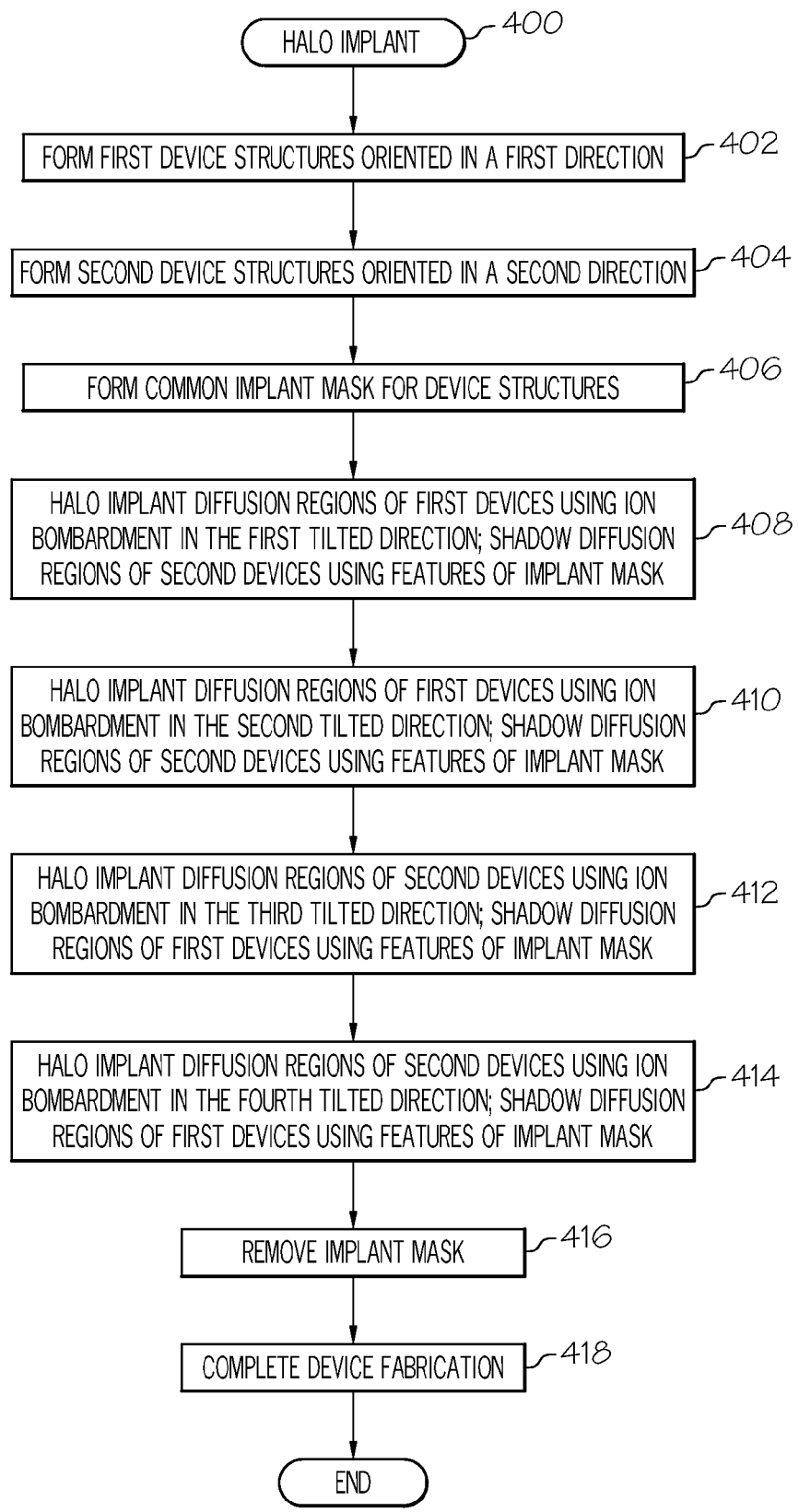
FIG. 7 is a flow chart that illustrates an embodiment of a halo implant process.

The halo implantation techniques described herein can be utilized to form semiconductor transistor devices having different threshold voltages, where the devices are formed on a common wafer, and where multiple halo implant masks need not be used. In this regard, FIG. 7 is a flow chart that illustrates an embodiment of a halo implant process. For illustrative purposes, the following description of process 400 may refer to fabrication steps mentioned above. In practice, portions of process 400 may be performed by different semiconductor fabrication tools, e.g., a photolithography component, an implanter component, or the like. It should be appreciated that process 400 may include any number of additional or alternative tasks, the tasks shown in FIG. 7 need not be performed in the illustrated order, and process 400 may be incorporated into a more comprehensive procedure or process having additional functionality not described in detail herein.

Halo implant process 400 may include or begin with the formation of one or more semiconductor device structures (such as transistor structures) oriented in a first direction relative to a reference direction of a wafer or substrate (task 402), and one or more semiconductor device structures (such as transistor structures) oriented in a second, different direction relative to the reference direction (task 404). Thereafter, process 400 forms a common implant mask for the device structures (task 406), where the implant mask has the desired halo implant shadowing characteristics, features, and topography necessary to accommodate the halo implant techniques described in more detail above with reference to FIGS. 3-6.

After an appropriate halo implant mask has been created, process 400 performs halo implanting for the diffusion regions of the device structures having the first orientation using ion bombardment at a first tilted direction (task 408). For this particular example, this first halo implanting step utilizes ion bombardment 322 (see FIG. 3). In connection with task 408, the wafer may be held in a first reference position such that the halo dopant approaching at the first tilted direction will indeed reach the intended diffusion regions. The halo implanting achieved during task 408 is controlled to achieve a first threshold voltage ($V_{T1}$) for the device structures having the first orientation. In this regard, the dosage of the halo dopant, the energy of the ion bombardment, the first tilted direction, and/or other parameters that influence the resulting halo implant are selected, monitored, controlled, or adjusted as needed. Concurrently with the halo implanting of task 408, the diffusion regions of the device structures having the second orientation are shadowed and protected from this ion bombardment (see FIG. 5, which shows diffusion region 358 being protected from ion bombardment 322). As mentioned above, certain features of the halo implant mask are used for this shadowing effect.

Following task 408, process 400 performs halo implanting for the diffusion regions of the device structures having the first orientation using ion bombardment at a second tilted direction (task 410). Notably, this halo implanting step can be performed without modifying the halo implant mask created during task 406. In other words, the same halo implant mask is used during task 408 and task 410. For this particular example, this second halo implanting step utilizes ion bombardment 324 (see FIG. 3). In connection with task 410, the wafer may be rotated 180 degrees and held in a second reference position such that the halo dopant approaching at the second tilted direction will indeed reach the intended diffusion regions. Alternatively, the implanting tool may be suitably configured to generate ion bombardment 324 in the proper direction with the wafer remaining in the first reference position. The halo implanting achieved during task 410 is controlled to achieve the $V_{T1}$ for the device structures having the first orientation. In this regard, the dosage of the halo dopant, the energy of the ion bombardment, the second tilted direction, and/or other parameters that influence the resulting halo implant are selected, monitored, controlled, or adjusted as needed. Concurrently with the halo implanting of task 410, the diffusion regions of the device structures having the second orientation are shadowed and protected from this ion bombardment (see FIG. 5, which shows diffusion region 358 being protected from ion bombardment 324). As mentioned above, certain features of the halo implant mask are used for this shadowing effect.

After the halo implants created during tasks 408 and 410 have achieved the desired $V_{T1}$, then process 400 may proceed to the next halo implant step (task 412). During task 412, process 400 performs halo implanting for the diffusion regions of the device structures having the second orientation using ion bombardment at a third tilted direction. Notably, this halo implanting step can be performed without modifying the halo implant mask created during task 406. In other words, the same halo implant mask is used during tasks 408, 410, and 412. For this particular example, this third halo implanting step utilizes ion bombardment 326 (see FIG. 5). In connection with task 412, the wafer may be rotated an additional 90 degrees and held in a third reference position such that the halo dopant approaching at the third tilted direction will indeed reach the intended diffusion regions. Alternatively, the implanting tool may be suitably configured to generate ion bombardment 326 in the proper direction with the wafer remaining in a specified reference position. The halo implanting achieved during task 412 is controlled to achieve a second threshold voltage ($V_{T2}$) for the device structures having the second orientation, where $V_{T1}$ does not equal $V_{T2}$. In this regard, the dosage of the halo dopant, the energy of the ion bombardment, the third tilted direction, and/or other parameters that influence the resulting halo implant are selected, monitored, controlled, or adjusted as needed. Concurrently with the halo implanting of task 412, the diffusion regions of the device structures having the first orientation are shadowed and protected from this ion bombardment (see FIG. 3, which shows diffusion region 308 being protected from ion bombardment 326). As mentioned above, certain features of the halo implant mask are used for this shadowing effect.

Following task 412, process 400 performs halo implanting for the diffusion regions of the device structures having the second orientation using ion bombardment at a fourth tilted direction (task 414). Notably, this halo implanting step can be performed without modifying the halo implant mask created during task 406. In other words, the same halo implant mask is used during tasks 408, 410, 412, and 414. For this particular example, this fourth halo implanting step utilizes ion bombardment 328 (see FIG. 5). In connection with task 414, the wafer may be rotated an additional 180 degrees and held in a fourth reference position such that the halo dopant approaching at the fourth tilted direction will indeed reach the intended diffusion regions. Alternatively, the implanting tool may be suitably configured to generate ion bombardment 328 in the proper direction with the wafer remaining in a specified reference position. The halo implanting achieved during task 414 is controlled to achieve the $V_{T2}$ for the device structures having the second orientation. In this regard, the dosage of the halo dopant, the energy of the ion bombardment, the fourth tilted direction, and/or other parameters that influence the resulting halo implant are selected, monitored, controlled, or adjusted as needed. Concurrently with the halo implanting of task 414, the diffusion regions of the device structures having the first orientation are shadowed and protected from this ion bombardment (see FIG. 3, which shows diffusion region 308 being protected from ion bombardment 328). As mentioned above, certain features of the halo implant mask are used for this shadowing effect.

After the halo implants created during tasks 412 and 414 have achieved the desired $V_{T2}$, then the halo implant mask, or portions thereof, can be removed (task 416) as needed. Thereafter, any number of known process steps can be performed to complete the fabrication of the semiconductor devices (task 418). It should be appreciated that any number of transistor devices having different layout orientations on a single wafer can be concurrently fabricated using the techniques and technologies described above.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A halo implant method for semiconductor devices, the method comprising:
   forming a first device structure on a semiconductor substrate, the first device structure comprising a first diffusion region that represents source and drain regions and a gate channel of the first device structure, and the first device structure comprising a first gate structure over the first diffusion region, the first gate structure being oriented in a first direction relative to a reference direction;
   forming a second device structure on the semiconductor substrate, the second device structure comprising a second diffusion region that represents source and drain regions and a gate channel of the second device structure, and the second device structure comprising a second gate structure over the second diffusion region, the second gate structure being oriented in a second direction relative to the reference direction;
   forming an implant mask that selectively masks portions of the first device structure while leaving the first diffusion region substantially exposed, and that selectively masks portions of the second device structure while leaving the second diffusion region substantially exposed;
   halo implanting the first diffusion region using a first ion bombardment oriented in a first tilted direction, the implant mask shadowing the second diffusion region from the first ion bombardment; and
   halo implanting the second diffusion region using a second ion bombardment oriented in a second tilted direction, the implant mask shadowing the first diffusion region from the second ion bombardment.

2. The halo implant method of claim 1, wherein the first direction and the second direction are orthogonal.

3. The halo implant method of claim 2, wherein:
   the first tilted direction has a first projected direction on the semiconductor substrate;
   the second tilted direction has a second projected direction on the semiconductor substrate; and
   the first projected direction and the second projected direction are orthogonal.

4. The halo implant method of claim 1, further comprising:
   halo implanting the first diffusion region using a third ion bombardment oriented in a third tilted direction, the implant mask shadowing the second diffusion region from the third ion bombardment; and
   halo implanting the second diffusion region using a fourth ion bombardment oriented in a fourth tilted direction, the implant mask shadowing the first diffusion region from the fourth ion bombardment.

5. The halo implant method of claim 1, further comprising:
   controlling the halo implanting of the first diffusion region to achieve a first threshold voltage for the first device structure; and
   controlling the halo implanting of the second diffusion region to achieve a second threshold voltage for the second device structure.

6. The halo implant method of claim 1, wherein:
forming the first device structure comprises forming the first diffusion region from silicon-on-insulator; and
forming the second device structure comprises forming the second diffusion region from silicon-on-insulator.

7. A method of forming semiconductor transistor devices, the method comprising:
providing a semiconductor wafer having formed thereon a first transistor device structure comprising a first diffusion region that represents source and drain regions and a gate channel of the first transistor device structure, and a second transistor device structure comprising a second diffusion region that represents source and drain regions and a gate channel of the second transistor device structure;
forming an implant mask over selective portions of the first transistor device structure and over selective portions of the second transistor device structure, such that the first diffusion region and the source and drain regions of the first transistor device structure are fully exposed and become susceptible to halo implanting using ion bombardment oriented in a first tilted direction and immune to halo implanting using ion bombardment oriented in a second tilted direction, and such that the second diffusion region and the source and drain regions of the second transistor device structure are fully exposed and become susceptible to halo implanting using ion bombardment oriented in the second tilted direction and immune to halo implanting using ion bombardment oriented in the first tilted direction;
halo implanting the first diffusion region using ion bombardment oriented in the first tilted direction; and
halo implanting the second diffusion region using ion bombardment oriented in the second tilted direction.

8. The method of claim 7, wherein:
during halo implanting of the first diffusion region, features of the implant mask corresponding to the second transistor device structure prevent ion bombardment oriented in the first tilted direction from directly reaching the second diffusion region; and
during halo implanting of the second diffusion region, features of the implant mask corresponding to the first transistor device structure prevent ion bombardment oriented in the second tilted direction from directly reaching the first diffusion region.

9. The method of claim 7, wherein:
the first transistor device structure comprises a first gate structure over the first diffusion region, the first gate structure being oriented in a first direction relative to a reference direction; and
the second transistor device structure comprises a second gate structure over the second diffusion region, the second gate structure being oriented in a second direction relative to the reference direction.

10. The method of claim 9, wherein the first direction and the second direction are orthogonal.

11. The method of claim 10, wherein:
the first tilted direction has a first projected direction on the semiconductor wafer;
the second tilted direction has a second projected direction on the semiconductor wafer; and
the first projected direction and the second projected direction are orthogonal.

12. The method of claim 7, wherein:
during halo implanting of the first diffusion region, the ion bombardment is controlled to achieve a first threshold voltage for the first transistor device structure; and
during halo implanting of the second diffusion region, the ion bombardment is controlled to achieve a second threshold voltage for the second transistor device structure.

13. A halo implant method for a semiconductor wafer having formed thereon a first device structure comprising a first diffusion region that represents source and drain regions of the first device structure, and a second device structure comprising a second diffusion region that represents source and drain regions of the second device structure, the first device structure and the second device structure being oriented in different directions, the method comprising:
forming an implant mask over selective portions of the first device structure and over selective portions of the second device structure, such that the first diffusion region and the second diffusion region remain substantially exposed;
halo implanting the source region of the first diffusion region, without halo implanting the second diffusion region, using a first ion bombardment oriented in a first tilted direction that has a first projected direction on the semiconductor wafer, the implant mask protecting the second diffusion region from the first ion bombardment;
halo implanting the source region of the second diffusion region, without halo implanting the first diffusion region, using a second ion bombardment oriented in a second tilted direction that has a second projected direction on the semiconductor wafer, the implant mask protecting the first diffusion region from the second ion bombardment;
halo implanting the drain region of the first diffusion region, without halo implanting the second diffusion region, using a third ion bombardment oriented in a third tilted direction that has a third projected direction on the semiconductor wafer, the implant mask protecting the second diffusion region from the third ion bombardment; and
halo implanting the drain region of the second diffusion region, without halo implanting the first diffusion region, using a fourth ion bombardment oriented in a fourth tilted direction that has a fourth projected direction on the semiconductor wafer, the implant mask protecting the first diffusion region from the fourth ion bombardment; wherein
the first projected direction and the third projected direction are anti-parallel, the second projected direction and the fourth projected direction are anti-parallel, the first projected direction is orthogonal to both the second projected direction and the fourth projected direction, and the third projected direction is orthogonal to both the second projected direction and the fourth projected direction.

14. The halo implant method of claim 13, further comprising:
controlling the halo implanting of the first diffusion region to achieve a first threshold voltage for the first device structure; and
controlling the halo implanting of the second diffusion region to achieve a second threshold voltage for the second device structure.

15. The halo implant method of claim 13, wherein forming the implant mask comprises forming the implant mask with a topography that makes the first diffusion region susceptible to halo implanting using ion bombardment oriented in the first and third tilted directions and immune to halo implanting using ion bombardment oriented in the second and fourth tilted directions, and that makes the second diffusion region susceptible to halo implanting using ion bombardment oriented in the second and fourth tilted directions and immune to halo implanting using ion bombardment oriented in the first and third tilted directions.

16. The halo implant method of claim 13, wherein:

during halo implanting of the first diffusion region, features of the implant mask corresponding to the second device structure prevent ion bombardment oriented in the first and third tilted directions from directly reaching the second diffusion region; and during halo implanting of the second diffusion region, features of the implant mask corresponding to the first device structure prevent ion bombardment oriented in the second and fourth tilted directions from directly reaching the first diffusion region.

* * * * *